March 11, 1969 O. A. FICK 3,432,774

VOLTAGE-TUNED WIEN BRIDGE OSCILLATOR

Filed Aug. 8, 1967

INVENTOR.
OLIVER A. FICK

BY
Roland A. Anderson
ATTORNEY

United States Patent Office 3,432,774

Patented Mar. 11, 1969

3,432,774
VOLTAGE-TUNED WIEN BRIDGE OSCILLATOR

Oliver A. Fick, Livermore, Calif., assignor to the United States of America as represented by the United States Atomic Energy Commission

Filed Aug. 8, 1967, Ser. No. 659,568
U.S. Cl. 331—141 2 Claims
Int. Cl. H03b *5/26, 3/02, 5/38*

ABSTRACT OF THE DISCLOSURE

The drain source resistances of two field effect transistors are arranged in a resistive-capacitive oscillator, for example a Wein bridge oscillator, as variable resistive elements to provide a voltage-controlled resistance-tuned oscillator. A modification includes a third field effect transistor, arranged in a nonreactive branch of a Wien bridge oscillator, and provided with a feedback signal from the output of the oscillator, for stabilizing the amplitude of the oscillator signal in place of the heretofore conventional use of thermal feedback elements.

*Background of the invention*

This invention relates to a class of oscillators commonly referred to as resistive-capacitive regenerative oscillators, and more particularly, to an electrical circuit utilizing field effect transistors as variable resistance elements in the reactive branches of such oscillators to provide voltage control of the frequency output thereof.

Resistive-capacitive oscillators are based on a principle of regenerative coupling achieved by amplifying a signal drive from one portion of a resistive-capacitive network, and simultaneously applying it, in phase with positive feedback, to another portion of the same network. A more detailed description of these oscillators may be found on pp. 482 to 484, in Electronic Measurements, McGraw-Hill, 2nd Edition, New York. In conventional designs of these resistive-capacitive oscillators, for example, Wien bridge oscillators, the frequency outputs thereof have been controlled by mechanically variable capacitive or resistive elements. While such devices have found widespread use as variable frequency oscillators, it would be desirable to provide, in many applications, an oscillator capable of being controlled in frequency by a variable voltage source. For example, a voltage controlled Wien bridge oscillator, such as described here, may be used as VCO's in telemetry systems, bridge-tuned narrow band amplifiers, lock-in reference oscillators for synchronous amplifiers and detectors, sweep generators, and voltage-to-frequency converters.

*Summary of the invention*

Accordingly, it is a general object of the invention to provide an electrically tunable regenerative oscillator.

It is a further object of the invention to provide a voltage controlled Wien bridge oscillator.

Another important object of the invention is to provide a simple, stable, light weight, electrically responsive oscillator, exhibiting low power consumption characteristics.

It is a more particular object of the invention to provide a voltage controlled Wien bridge oscillator productive of a frequency range from 0 cycles per second to approximately 1 megacycle per second.

It is still a further object of the invention to provide a Wien bridge oscillator having an electrical feedback network, such that operation of the oscillator at exceptionally low power levels is practical.

Accordingly, the invention described herein takes advantage of the uniquely high input and transfer impedance of field effect transistors, together with the voltage dependent resistive characteristics thereof, to provide a resistive-capacitive regenerative oscillator having a frequency output dependent upon a variable voltage control signal, while maintaining isolation between the control signal and thte oscillator itself. In a particular embodiment of the invention, a Wien bridge oscillator, utilizing voltage controlled field effect transistors to provide variable resistive elements therein, also incorporates a novel electrical feedback network for stabilizing the amplitude output of the oscillator. This latter feature of the invention permits operation of the Wien bridge oscillator at extremely low levels of power consumption, thus rendering the circuit extremely attractive for space applications and other system applications where low power consumption is desirable.

*Brief description of the drawings*

Other important objects and features, together with a fuller understanding of the invention, will be presented by reference to the following specification and drawings, in which.

*Description of the preferred embodiment*

Figures 1, 2:
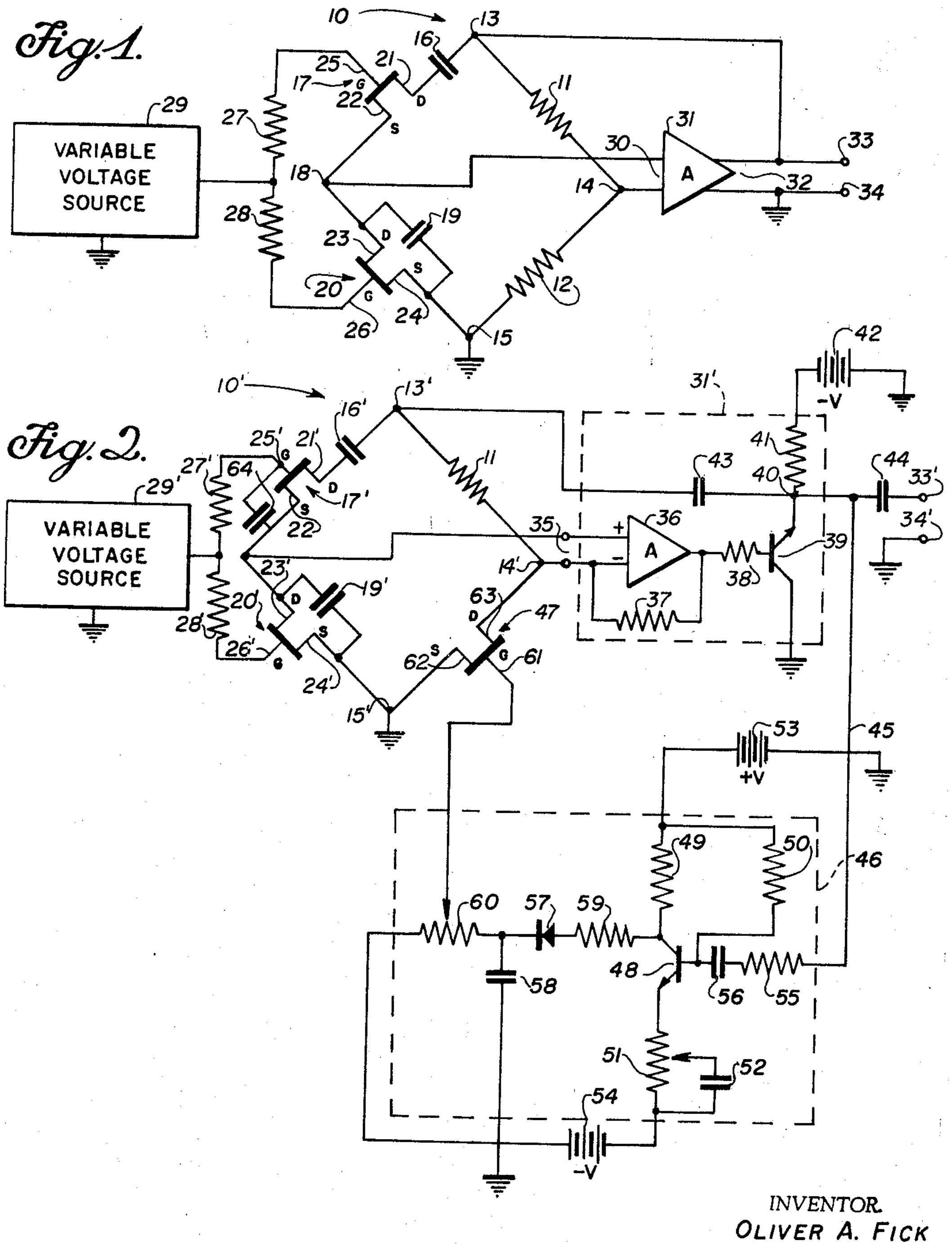
FIGURE 1 is a schematic diagram of a Wien bridge oscillator using a pair of voltage controlled field effect transistors as variable resistive elements therein.
FIGURE 2 is a schematic diagram of a particular embodiment of the invention, utilizing an electrical feedback network including a third field effect transistor.

Referring now specifically to FIGURE 1, a Wien bridge 10 is shown having a pair of nonreactive branches comprised of resistors 11 and 12, respectively connected in series between terminals 13 and 14; 14 and 15 (ground). A pair of reactive branches of Wien bridge 10 are serially connected across terminals 13 and 15, comprising serially arranged capacitor 16 and the drain source terminls 21 and 22 of field effect transistor 17 (hereinafter called FET 17), interconnected terminals 13 and 18; and parallel capacitor 19 and the drain source terminals 23 and 24 of field effect transistor 20 (hereinafter called FET 20), electrically connected between terminals 18 and 15. FET's 17 and 20 are provided with connections between gate terminals thereof respectively 25 and 26, through isolation resistors, respectively 27 and 28, to a first terminal of variable voltage source 29. A second terminal of source 29 is attached to ground. An input 30 to amplifier 31 is connected across opposing terminals 18 and 14 of bridge 10, while an output 32 is attached across terminals 13 and 15 (ground). The output of the oscillator appears across terminals 33 and 34 (ground).

In selecting the components for the circuit shown in FIGURE 1, in order to enhance the fidelity of the output signal and to provide convenient frequency control thereof, capacitors 16 and 19 are selected to be of equal value. FET 17 and 20 should have matched drain source resistance vs. gate voltage characteristics. Resistor 11 should be slightly greater than resistor 10, and resistors 27 and 28 should provide substantial impedance isolation between the respective gate terminals 25 and 26 of FET's 17 and 20.

In operation of the voltage controlled Wien bridge oscillator shown in FIGURE 1, the alternate series parallel reactive branches comprised of capacitors 16 and 19, and the drain source resistances of field effect transistors 17 and 20 provide a relative phase shift between the signal appearing across terminals 14 and 18 and the signal appearing across terminals 13 and 15. This phase shift is functionally dependent upon the frequency of oscillation of the signal appearing across terminals 13 and 15. Particularly, the phase shift between the bridge 10 input terminals 13 and 15 and the bridge 10 output terminals 14 and 18 approaches zero when the frequency of the bridge 10 output provides equal and opposing phase shifts in the serial and parallel capacitive-resistive reactive branches of bridge 10. For capacitors 16 and 19 equal to a common value (C), and for the drain-source resistances of FET's 17 and 20 equal to a common resistance (R), this zero phase shift frequency (F) is equal to $(1/2\pi RC)$. Moreover, it is noted that at this zero phase shift frequency, the output of bridge 10 terminals 14 and 18 is amplified by amplifier 31 and applied across the input of bridge 10 (terminals 13 and 15) to provide a positive feedback system due to the phase coincidence of the input and output signals, thereby maintaining circuit oscillations at the zero phase shift frequency. To achieve a small output voltage across terminals 18 and 14 necessary for operation of the circuit as an oscillator, resistor 11 is slightly greater than resistor 12 to provide a nominal unbalance of bridge 10 and thus an output voltage signal across terminals 18 and 14. In summary, the oscillation mode is provided by a regenerative coupling between the output of bridge 10 (terminals 14 and 18) and the input (terminals 13 and 15).

In order to vary the zero phase shift frequency, i.e., the frequency of the oscillator output, the resistive impedances appearing between the drain-source terminals of FET's 17 and 20 are simultaneously varied in response to a voltage signal from source 29 applied to gate terminals 25 and 26 through resistors 27 and 28, respectively. Note that the frequency varies as $(1/R)$ where R is equal to a common value for both the drain-source resistances of FET's 17 and 20. It is known that for small reverse bias gate-to-source voltages, field effect transistors (both of the MOS and junction class) exhibit a functional variation in the drain-to-source resistance, for small signal variations in the gate-to-source voltage. Moreover, it is a characteristic of field effect transistors that the input impedance, i.e., gate-to-source impedance, may be as high as 10,000 megohms, and that the transfer impedance, or isolation between the drain-source circuit and the gate-source circuit, may be on the same order of magnitude. Accordingly, these unique features of FETS's have been utilized to provide voltage controlled frequency dependent, isolated resistive elements in the Wien bridge oscillator, as shown in FIGURE 1. Without the high input impedance and equally high transfer or isolation impedance, as discussed above, electrical oscillations within Wien bridge 10 would degenerate due to inherent feedback between voltage control source 29 and the Wien bridge proper. Furthermore, large resistance ratio variations are exhibited across the drain source terminals of field effect transistors approaching in some cases ratios greater than 100 to 1, for small signal gate-to-source voltage changes in the range of zero to 4 volts.

It is noted that the voltage applied to gate 26 of FET 20 appears directly across the gate-source terminals 26 and 24 of FET 20 due to the connection of source terminal 24 to ground terminal 15. At variance therewith, the voltage applied to gate terminal 25 of FET 17 is developed across both the gate-source terminals 25 and 22 of FET 17 and the drain source terminals 23 and 24 of FET 20 due to the circuit path through FET 20 to ground terminal 15. However, the gate-source impedance of FET 17 is many orders of magnitude greater than the drain-source resistance of FET 20, and thus source terminal 22 of FET 17 appears essentially at ground 15, thereby providing for equal gate-source voltage drops across both FET's 17 and 20 for a common variable voltage source 29. In turn, the equal gate-source voltage variations provide for equal and simultaneous drain-source resistance variations for FET 17 and FET 20.

In summary, the operation of the circuit of FIGURE 1 provides, through the use of a pair of field effect transistors 17 and 20, resistive tuned regenerative oscillations having a frequency output controlled by a voltage signal wherein the control voltage signal (source 29) is exceedingly electrically isolated from the frequency-dependent resistive elements, i.e., the drain-source resistances of FET's 17 and 20.

FIGURE 2 shows an embodiment of the invention incorporating a unique electrical feedback network for stabilizing the output of the oscillator and further includsome preferred refinements over the circuit shown in FIGURE 1. Those components set forth in FIGURE 1 which reappear in FIGURE 2 are denoted by a primed reference numeral corresponding to the reference numerals in FIGURE 1. For example, FIGURE 2 shows a Wien bridge 10 interconnected terminals 18', 13', 14' and 15' (ground), including FET's 17' and 20'; capacitors 16' and 19', and resistor 11'. In the embodiment of FIGURE 2, an amplifier 31' is provided with an input 35 connected across bridge 10 terminals 18' and 14'. Amplifier 31' includes a differential amplifier 36 having a feedback compensating resistor 37 connected thereacross for stabilization. The output of differential amplifier 36 is fed through resistor 38 to the base of transistor 39, which transistor 39 is arranged with a collector-resistor 41 and the collector voltage source 42. Transistor 39 further amplifies the output of differential amplifier 36, and provides an output voltage with respect to ground at junction 40. The output signal appearing at junction 40, i.e., the amplified signal presented across terminals 18' and 14' by the output of bridge 10' is coupled to the input terminals 13' and 15', through blocking capacitor 43 and ground. Amplifier 31', as in FIGURE 1, for amplifier 31, provides the regenerative coupling between the output and input of bridge 10 to form the basic oscillator circuit. The output of the oscillator shown in FIGURE 2 appears at terminals 33' and 34', wherein capacitor 44 couples junction 40 with terminal 33'. The signal at junction 40 is also connected to a feedback network 46 over line 45, wherein the output of network 46 appearing across variable potentiometer 60 controls the gate-source voltage of field effect transistor 47 (FET 47) and thus the drain-source resistance across terminals 62 and 63 thereof. More particularly, feedback network 46 includes an amplifying means comprised of transistor 48, biasing resistors 49 and 50, and an emitter feedback network or gain control consisting of potentiometer 51 and capacitor 52, and DC voltage sources 53 and 54. The base of transistor 48 receives an alternating current signal through current-limiting resistor 55 and blocking capacitor 56, and produces an amplified signal thereof at the collector of transistor 48, which amplified signal is applied acros a rectifying means comprised of diode 57 and capacitor 58, through resistor 59. Potentiometer 60, connected between diode 57 and ground, has a wiper arm attached to gate terminal 61 of FET 47, providing at gate terminal 61 a voltage divider selection of the rectified voltage appearing across potentiometer 60 as supplied by the rectified and filtered alternating current signal emanating from the collector of transistor 48. Field effect transistor 47, connected with source terminal 62 to terminal 15' (ground) and with drain terminal 63 to terminal 14', provides a second resistive branch for bridge 10', corresponding to resistor 12 of FIGURE 1.

Additionally, in the embodiment shown in FIGURE 2, a capacitor 64 is connected across gate-source terminals 25' and 22' of FET 17', to short out voltage fluctuations tending to appear across the gate-source terminals of FET 17' due to the large oscillating voltage signals presented across drain-source terminals 21' and 22' of FET 17'.

The operation of the circuit shown in FIGURE 2 is essentially the same as described in conjunction with FIGURE 1, with the following significant exceptions. As briefly mentioned, capacitor 64 acts to filter out alternating electrical signals appearing across gate-source terminals 25' and 22' of FET 17'. More specifically, included capacitor 64 enhances the frequency-dependent resistance stability of the drain-source terminals 21' and 22' of FET 17' by maintaining the gate-source voltage thereof proportional solely to the output of variable source 29'. It will be appreciated that a similar arrangement of a capacitor across the gate-source terminals of FET 20' will generally be of limited advantage in view of the relatively low amplitude voltage variation appearing across the drain-source terminals of FET 20' due to the parallel arrangement of capacitor 19' therewith.

Still more importantly, the embodiment depicted in FIGURE 2 incorporates an output-limiting feedback circuit comprised of FET 47 and feedback network 46. In conventional Wien bridge oscillators, it is common to conventional wien bridge oscillators, it is common to include in the branch between terminals 14' and 15' a thermal feedback element, e.g., a resistive lamp or thermistor. In such cases, in response to an increase in signal amplitude of the oscillator output (terminals 13' and 15') and a corresponding increase in the voltage across such a thermal feedback element, the resistance thereof increases, tending to balance the bridge, i.e., decrease the signal output appearing across terminals 18' and 14'. The decrease in the bridge output signal, accordingly, decreases the input to the amplifier and the output of the oscillator, thus tending to maintain the oscillator output at a desired constant level. Circuits incorporating thermal feedback elements generally require a certain minimum level of operational power, e.g., 40 milliwatts, and thus in many applications are undesirable. Accordingly, in FIGURE 2, FET 47 is included in place of a thermal feedback element and provided with a unidirectional feedback signal proportional to the output of the oscillator, which output appears at junction 40. In response to an increase in the output amplitude, feedback network 46 generates a continuous voltage signal, i.e., rectified alternating current, proportional thereto, which is applied across the gate source terminals 61 and 62 of FET 47. An increase in the output of the oscillator appearing at junction 40 induces an increase in the continuous voltage feedback signal which is applied to gate terminal 61 of FET 47, thus increasing the gate-source voltage and accordingly increasing the drain-source resistance of FET 47. This increase in the drain-source resistance, as presented across drain terminal 63 and source terminal 62, tends to balance bridge 10' and decrease the input to amplifier 31', effectuating a decrease in the oscillator output at terminal 40. The resultng operation is an electrical feedback circuit exhibiting enhanced stability, while operating at power levels below 40 milliwatts.

Without the intent of detracting from the broad scope of the invention, the following suggested list of components is included for the circuit of FIGURE 2, as an aid to those who desire to practice the invention:

| Item | Value or type |
|---|---|
| Resistors: | |
| 11' | 3K ohms. |
| 27' | 1 megohm. |
| 28' | 1 megohm. |
| 37 | 1 megohm. |
| 38 | 82K ohms. |
| 41 | 13K ohms. |
| 49 | 2K ohms. |
| 50 | 147K ohms. |
| Potentiometer 51 | 1K ohm. |
| Resistor 55 | 5.1K ohms. |
| Resistor 59 | 10K ohms. |
| Potentiometer 60 | 1 megohm. |
| Capacitors: | |
| 16' | .1 μf. |
| 19' | .1 μf. |
| 43 | 22 μf., 15 v. |
| 44 | 50 μf., 15 v. |
| 52 | 50 μf., 10 v. |
| 56 | 10 μf., 10 v. |
| 58 | 3 μf., 10 v. |
| FET 17' and 20' | 2N2500 (matched for $R_{ds}$ vs. $V_{gs}$ for a wide range of operation). |
| FET 47 | 2N2500. |
| Transistor 39 | 2N697. |
| Variable voltage source 29' | 0–4 v. output. |
| Differential amplifier 36 | Burr-Brown 1506. |
| DC voltage sources: | |
| 42 | —13.5 v. |
| 53 | +13.5 v. |
| 54 | —13.5 v. |

A device conforming to the above values has been constructed and tested; it was found to provide a variable frequency range from 25 cycles per second to 100 kilocycles per second, exhibiting an exceptionally stable output over the entire frequency spectrum. Furthermore, the exceptionally low power requirements thereof made the circuit very desirable for airborne and space applications.

While FIGURE 1, and moreover FIGURE 2, show particularly advantageous embodiments of the invention, it will be recognized by those skilled in the art that numerous modifications thereof may be made to meet specialized applications. For example, in FIGURE 2, amplifier 31 may be a simple single-stage transistor amplifier or alternatively a two-stage multigrid tube amplifier. Furthermore, feedback network 46 may be of any number of designs providing a unidirectional electrical signal output proportional in magnitude to an alternating electrical signal input.

Thus, it will be appreciated that the foregoing disclosure of the invention is by way of example. Consequently, it is our intention that the following claims define the scope of the invention, rather than the specific embodiment shown and described above.

I claim:

1. An oscillator circuit capable of being controlled by an electrical signal, comprising:

(a) a resistive-capacitive regenerative feedback oscillator of the Wien bridge class having a frequency dependence on first and second two terminal resistive elements and including a pair of reactive branches and a pair of resistive branches, said oscillator further including an amplifier means for providing said regenerative feedback, a first of said reactive branches defined by said first two-terminal resistive element serially connected to a capacitor, the second of said reactive branches defined by said second two-terminal resistive element connected in parallel with a second capacitor;

(b) a first field effect transistor having a drain, source, and gate terminals; said transistor having said drain and source terminals connected in said first reactive branch to provide said first two-terminal resistive element; said transistor further having said gate and source terminals arranged for receiving an electrical control signal;

(c) a second field effect transistor having a drain, source and gate terminals; said second transistor having the drain and source terminals thereof connected in said second reactive branch to provide said second two-terminal resistive element; said second transistor further having the gate and source terminals thereof arranged for receiving said electrical control signal; and (d) a third capacitor interconnected between the gate and source terminals of said first transistor to short-circuit alternating voltages appearing therebetween.

2. The circuit of claim 1, further including a third field effect transistor having a drain-source resistance defining one of said resistive branches, and feedback means connected between said oscillator output and the gate, source terminals of said third transistor, for limiting the signal amplitude appearing at said output by controlling said drain-source resistance of said third field effect transistor.

(References on following page)

References Cited

UNITED STATES PATENTS

| | | | |
|---|---|---|---|
| 3,070,762 | 12/1962 | Evans | 333—70 |
| 3,127,577 | 3/1964 | Lapointe | 331—110 |
| 3,289,102 | 11/1966 | Hayashi | 331—108 |

OTHER REFERENCES

Hewlett-Packard Journal "A Wide-Range RC Oscillator with Push-Button Frequency Selection," vol. 14, No. 12, pp. 3, 4, 5, August 1963.

Electronic Design, "Digital Oscillator Provides Settable Frequencies, Voltages," July 20, 1964, 2 pages.

JOHN KOMINSKI, *Primary Examiner*.

U.S. Cl. X.R.

331—109, 183, 110; 333—70